United States Patent [19]

Iwahashi et al.

[11] Patent Number: 4,556,961
[45] Date of Patent: Dec. 3, 1985

[54] SEMICONDUCTOR MEMORY WITH DELAY MEANS TO REDUCE PEAK CURRENTS

[75] Inventors: Hiroshi Iwahashi, Yokohama; Masamichi Asano, Tokyo, both of Japan

[73] Assignee: Tokyo Shibaura Denki Kabushiki Kaisha, Japan

[21] Appl. No.: 379,852

[22] Filed: May 19, 1982

[30] Foreign Application Priority Data

May 26, 1981 [JP] Japan .................................. 56-79551
Aug. 7, 1981 [JP] Japan .................................. 56-123903

[51] Int. Cl.$^4$ ........................ G11C 11/40; G11C 7/00
[52] U.S. Cl. ................................... 365/194; 365/203; 365/227; 365/205
[58] Field of Search ............... 365/189, 194, 203, 205, 365/206, 208, 227, 207

[56] References Cited

U.S. PATENT DOCUMENTS

| | | | |
|---|---|---|---|
| 3,688,264 | 8/1972 | Dingwall | 340/173 |
| 3,706,078 | 12/1972 | Hilberg | 365/194 |
| 3,866,061 | 2/1975 | Wen et al. | 307/208 |
| 4,045,785 | 8/1977 | Kirkpatrick, Jr. | 340/173 |
| 4,204,277 | 5/1980 | Kinoshita | 365/203 |
| 4,222,112 | 9/1980 | Clemons et al. | 365/194 |
| 4,344,156 | 8/1982 | Eaton, Jr. et al. | 365/189 |
| 4,354,256 | 10/1982 | Miyasaka | 365/189 |
| 4,417,328 | 11/1983 | Ochii | 365/203 |

FOREIGN PATENT DOCUMENTS

| | | | |
|---|---|---|---|
| 1474480 | 12/1969 | Fed. Rep. of Germany . | |
| 150045 | 11/1979 | Japan | 365/203 |
| 130287 | 2/1981 | Japan | 365/208 |
| 1193642 | 6/1970 | United Kingdom | 365/194 |

OTHER PUBLICATIONS

General Instrument's New 8,192-Bit Earom Relies on Metal-Nitride-Oxide Technology . . . Electronics 40 (Sep. 16, 1976).

*Primary Examiner*—Stuart N. Hecker
*Assistant Examiner*—Glenn A. Gossage
*Attorney, Agent, or Firm*—Finnegan, Henderson, Farabow, Garrett & Dunner

[57] ABSTRACT

A semiconductor device comprises a plurality of data supply circuits, output circuits for producing a plurality of data delivered from the data supply circuit and delay circuit for transferring respective data from each data supply circuit to a different output circuit with a different delay time. Each data supply circuit includes a plurality of row lines, a row decoder for selecting the row line in response to an address signal, a plurality of memory cell arrays including memory cells selectively driven by the row line and storing data, a plurality of column lines to receive data read out from the memory cell array, and a column decoder for selecting said column lines. The delay circuit prevents a plurality of data from being simultaneously outputted.

2 Claims, 32 Drawing Figures

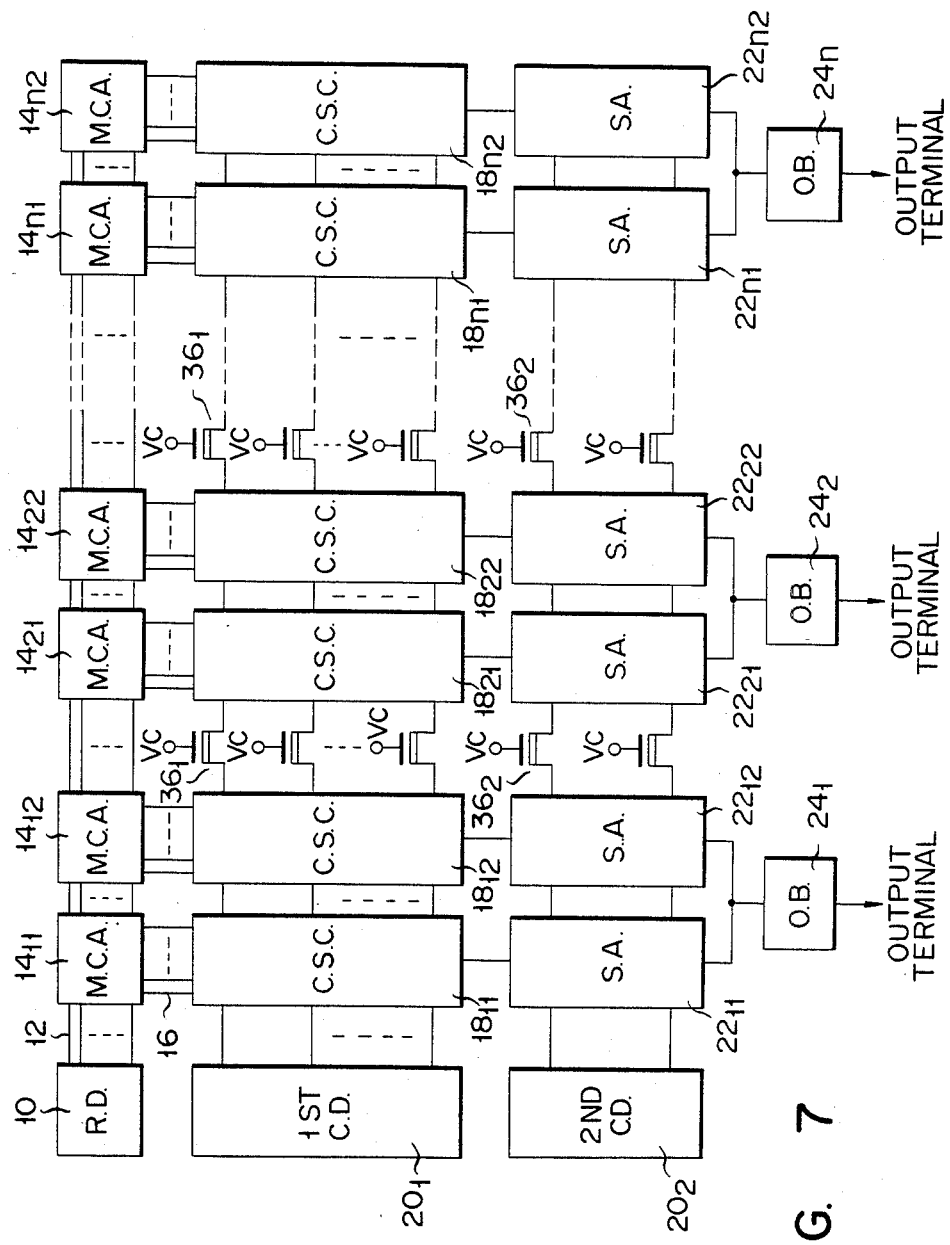
F I G. 7

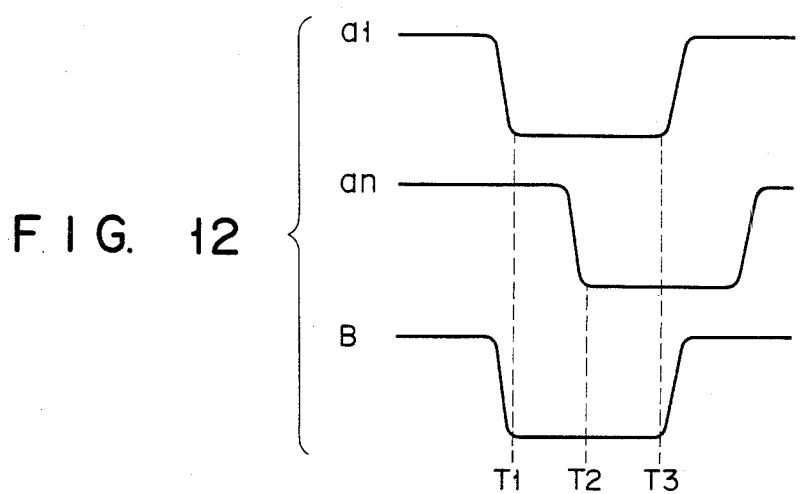
F I G. 12
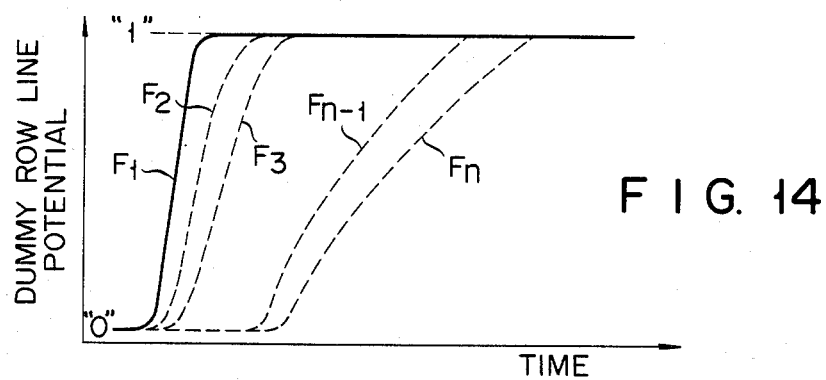
F I G. 14
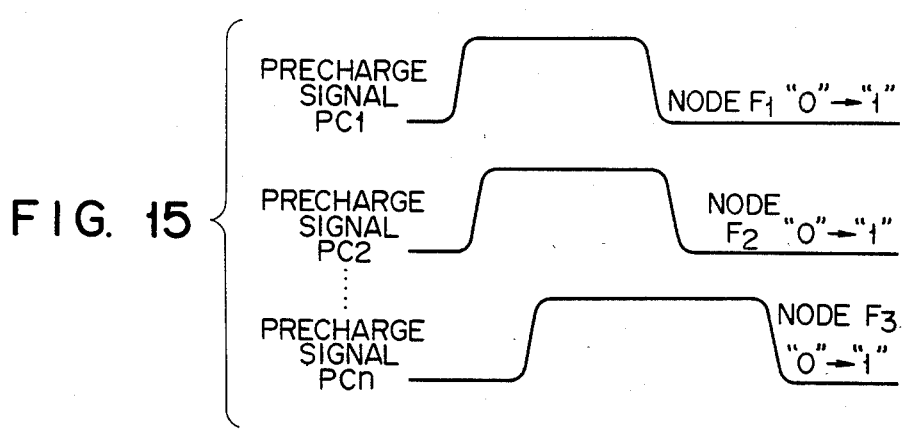
F I G. 15

FIG. 17
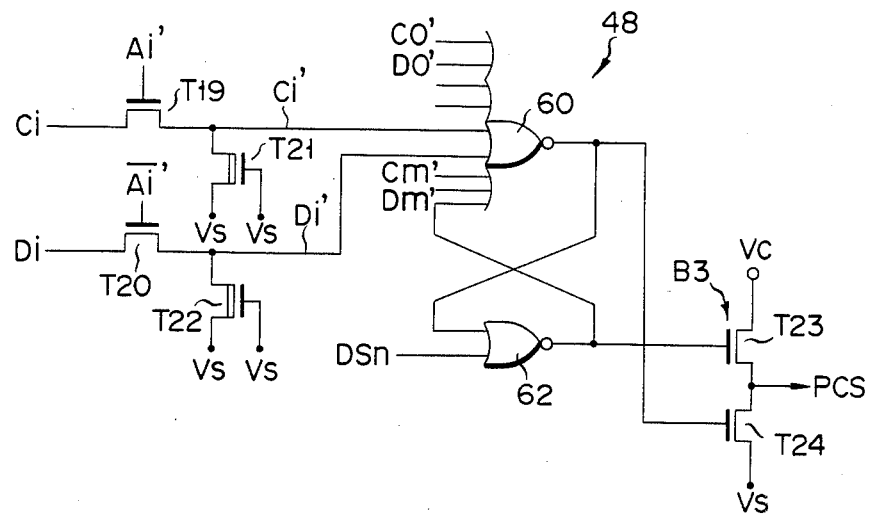
FIG. 18
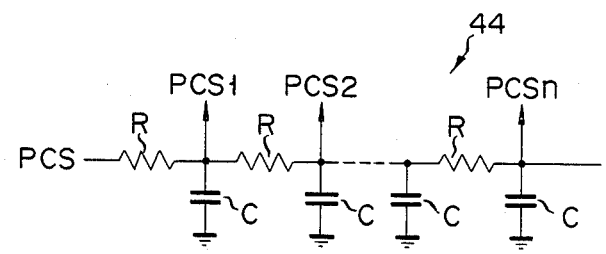
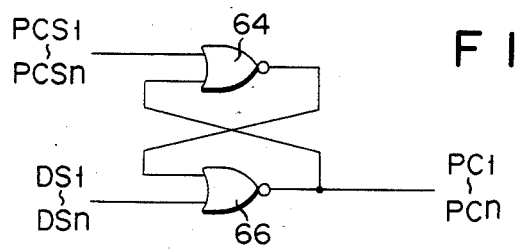
FIG. 19

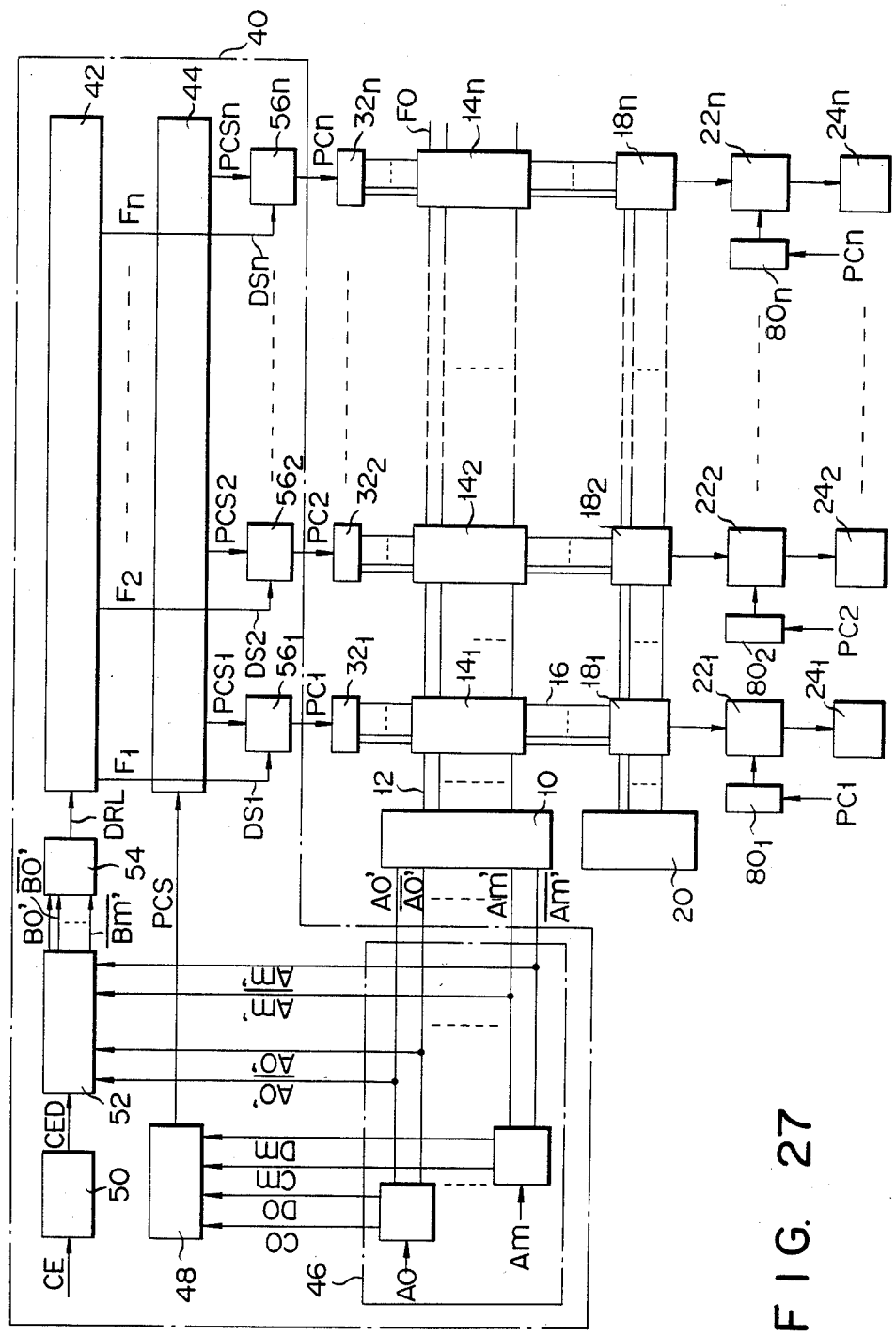
F I G. 27

SEMICONDUCTOR MEMORY WITH DELAY MEANS TO REDUCE PEAK CURRENTS

BACKGROUND OF THE INVENTION

The present invention relates to a semiconductor device having a plurality of output bits and, more particularly, to a semiconductor device with reduced peak current.

Generally, in microcomputers, the data processing speed is one of the important factors. In recent years, more speed up is required for the operations of central processing units (CPU) or memories.

In the microcomputer systems, the output of the semiconductor memory is coupled with the data bus. A capacitance present in the data bus is very large and in the semiconductor memory it reaches about 150 pF. In designing the semiconductor memories, time taken from the address input to the data output is determined by considering the capacitance of the data bus. That time is selected shorter as the operating speed of the semiconductor memory increases.

The predominantly used microcomputers are of 8 bit type. In the description to follow, the semiconductor memory of 8 bits output will be used. Assume that the output signals of 8 bits from the memory simultaneously change their logical state from "0" to "1". Further, assume that the memory output signal rises from 0 V to 3 V for 20 nsec. Since each bit has a capacitance of 150 pF, 8 bits have 1200 pF ($=150$ pF$\times 8$) capacitance and such a large capacitance must be driven. The necessary current I for driving the large capacitance is given by $I = CV/t = 8 \times 150 \times 10^{-12} \times 3/20 \times 10^{-9} = 180$ mA. In this example, 180 mA flows instantaneously. The ordinary operation current of the semiconductor memory is about 100 mA to 150 mA. For this reason, when such large current of 180 mA abruptly flows, noise is induced into the power source and the ground line, resulting in deterioration of the stable operation of the memory. In the RAM (random access memory), there is a danger that the data of the RAM are destroyed by the noise. An adverse effect of the induced noise on the peripheral integrated circuit must also be taken in account. Therefore, when the above memory is used, an additional consideration is required in designing the microcomputers.

The necessary current as mentioned above will be described referring to the semiconductor memory shown in FIG. 1. The semiconductor memory is comprised of a row decoder 10, a plurality of memory cell arrays $14_1$ to $14_n$ connected through a row line 12 to the row decoder 10, a plurality of column select circuits $18_1$ to $18_n$ connected through a column line 16 to the memory cell arrays $14_1$ to $14_n$, a column decoder 20 connected to the column select circuits $18_1$ to $18_n$, a plurality of sense amplifiers $22_1$ to $22_n$ correspondingly connected to the column select circuits $18_1$ to $18_n$, and a plurality of output buffer circuits $24_1$ to $24_n$ correspondingly connected to the sense amplifiers $22_1$ to $22_n$. The output terminals of the output buffer circuits $24_1$ to $24_n$ are correspondingly connected to external output terminals, respectively.

In each of the memory cell arrays $14_1$ to $14_n$, memory cells are located at cross points of the row lines 12 and the column lines 16. A desired memory cell at the cross points is specified by one of the row lines driven by the row decoder 10 in response to a row address input signal and one column line selected respectively by the column select circuits $18_1$ to $18_n$ driven by the column decoder 20 in response to a column address input signal. Through the consecutive memory cell specifying operations, data are read out bit by bit from the memory cell arrays $14_1$ to $14_n$. In this way, the data of 8 bits are sent to the external output terminals.

In the semiconductor memory, to minimize the chip size, the row lines are wired using polysilicon and the output lines of the column decoder 20 are wired using aluminum. Since polysilicon has normally 30 to 50 $\Omega/\mu^2$, a voltage on the row line remote from the row decoder 10 has a time delay with respect to that on the line near the row decoder 10. When a memory cell of each of the memory cell arrays is selected depending on a change of the row address, the memory cell near the row decoder is selected faster selected than the remote one. Accordingly, times that the data are produced from the selected memories are different depending on the locations of the selected memory cells from the row decoder 10. Therefore, the data of 8 bits are not simultaneously produced from the output buffers $24_1$ to $24_n$ and the above 180 mA never flows.

Let us consider a case where only the column address changes. The output lines from the column decoder 20 are made of aluminum, as previously stated, due to the pattern layout employed in their fabrication stage. Their resistance is about 0$\Omega$. In selecting the column lines by the column select circuit, each of the column selects circuits select a single column line. The column line selections by the select circuits are performed simultaneously. Therefore, 8-bit data are simultaneously outputted from the selected memory cells. Then, the 180 mA current instantaneously flows at this time, possibly resulting in an erroneous operation. Thus, when the column addresses change to produce data, there is the highest possibility that noise is induced into the power source and the ground line.

In FIG. 2, illustrating the output buffers of CPU, the output buffers $28_1$ to $28_n$ connected to an internal bus 26 produce data to an external bus 30 under control of a control signal S. When the control signal S is inputted to the output buffers $28_1$ to $28_n$ concurrently and the buffers operate, a large instantaneous current flows to cause noise in the semiconductor device.

FIG. 3 illustrates another prior semiconductor memory with a plurality of bits. The column lines of memory cell arrays $14_1$ to $14_n$ are simultaneously precharged by a column line precharge circuit 32, in synchronism with a precharge signal PC. The contents of the memory cell selected by the row decoder 10 appear on paired column lines $Q_1$ and $\overline{Q}_1$ to $Q_n$ and $\overline{Q}_n$. A column decoder 20 drives column select circuits $18_1$ to $18_n$. Data on the column lines decoded by the column select circuits $18_1$ to $18_n$ are sensed by sense amplifiers $22_1$ to $22_n$. The sensed values are outputted to output terminals through output buffers $24_1$ to $24_n$.

FIG. 4 shows yet another prior semiconductor memory with a plurality of output bits. The column lines of memory cell arrays $14_1$ to $14_n$ are simultaneously precharged by column line precharge circuits $32_1$ to $32_n$ in synchronism with a precharged signal PC. The data of the memory cell selected by the row decoder 10 appear on the column lines $Q_{11}$ to $Q_{nm}$. The data are sensed by corresponding sense amplifier circuits $22_1$ to $22_n$, respectively. The output signals from the sense amplifiers $22_1$ to $22_n$ are selected by column select circuits $18_1$ to $18_n$ and produced to output terminals $24_1$ to $24_n$, respectively.

In the prior semiconductor memories shown in FIGS. 3 and 4, a pulse width of the precharge signal PC is determined by detecting that the output signal from the row decoder 10 reaches the terminal $E_n$ of the row line 12 (FIG. 3). Since the row lines 12 are normally made of polysilicon, those have about 30 $\Omega/\square$. The row line 12 has a relatively large load capacitance since such lines are connected to the gates of the memory cell transistors. For this reason, there is a difference between a rise time of data at a node $E_o$ near the row decoder 10 and that at a node $E_n$ remote from the row decoder 10. To cope with this problem, the prior art precharges the column lines until the data on the row lines reach $E_n$ and the row lines 12 all have a "1" level. At an instant that the signal level on the row lines 12 becomes a "1" level, the precharge signal PC is stopped.

FIG. 5 shows an example of the precharge circuit.

In the semiconductor memory as mentioned above, at an instant that the precharge is stopped, the sense amplifiers $22_1$ to $22_n$ start to operate. The output data from the sense amplifiers are transferred to the output buffer circuits $24_1$ to $24_n$ of the data input/output circuit, respectively. In this way, the initial operation of the respective sense amplifiers and the outputs of data of the plurality of bits are performed concurrently. As a result, the instantaneous peak current is very large. This causes noise in the power source, like the FIG. 1 prior art. Additionally, the noise induced narrows an operating margin of the circuit in each memory. Since a large capacitance of about 150 pF is contained in the exterior circuit, as mentioned above, the instantaneous current due to the charge/discharge to and from the capacitor is considerably large.

SUMMARY OF THE INVENTION

Accordingly, an object of the present invention is to provide a semiconductor device which can prevent a plurality of data from being simultaneously outputted and can reduce instantaneous peak current.

To achieve the above object, a semiconductor device according to the present invention is comprised of a plurality of circuits for supplying data, a plurality of output circuits for receiving inputs from respective data supply circuits to produce data, and a delay circuit for delaying data transferred from respective output circuit.

With such an arrangement, data are prevented from being concurrently produced from the plurality of output circuits, so that the instantaneous peak current is small, thus suppressing generation of noise.

BRIEF DESCRIPTION OF THE DRAWINGS

Other objects and advantages of this invention will be apparent from the following description taken in connection with the accompanying drawings, in which:

FIG. 7 is a block diagram of a second embodiment of a semiconductor device according to the present invention;

FIG. 12 shows a timing chart useful in explaining the operation of the output buffer circuit shown in FIG. 11;

FIG. 14 shows potential change of respective node of the dummy column line used in the FIG. 13 circuit;

FIG. 15 shows a set of waveforms of precharge signals generated in the FIG. 13 circuit;

FIG. 17 is a circuit diagram of an address change detecting circuit used in the FIG. 13 circuit;

FIG. 18 is a circuit diagram of a delay circuit used in the FIG. 13 circuit;

FIG. 19 is a circuit diagram of a precharge signal generating circuit used in the FIG. 13 circuit;

FIG. 27 is a block diagram of a sixth embodiment of a semiconductor device according to the present invention.

DETAILED DESCRIPTION OF THE PREFERRED EMBODIMENTS

Figure 6:
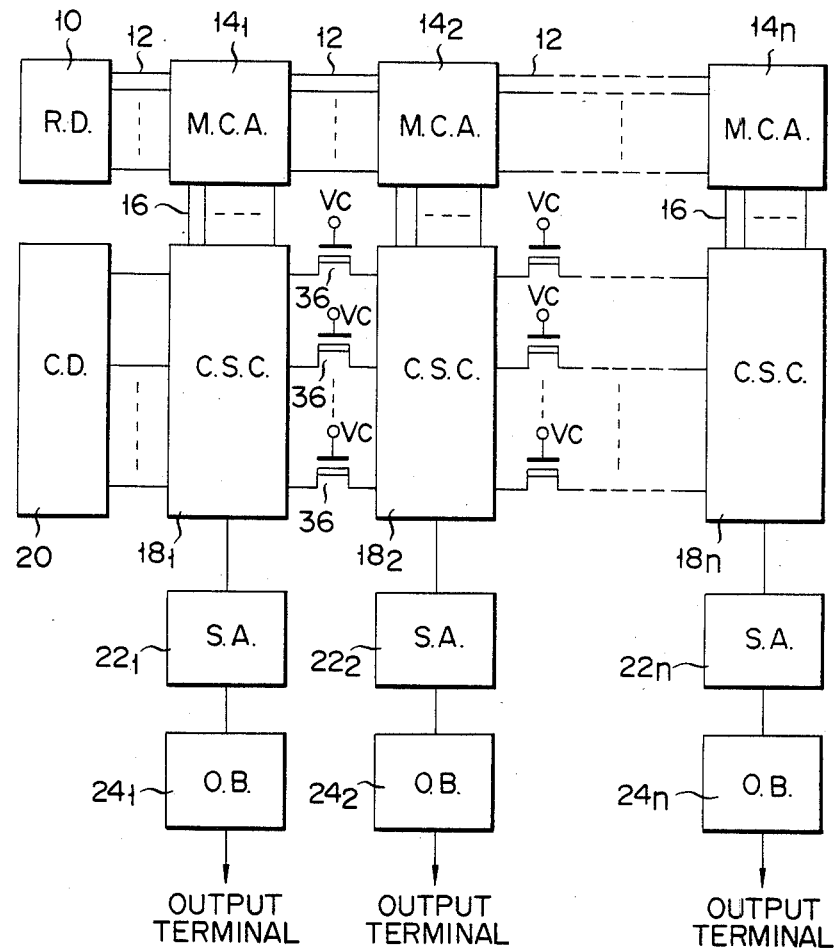
FIG. 6 is a block diagram of a first embodiment of a semiconductor device according to the present invention.

An embodiment of a semiconductor device according to the present invention will be described referring to FIG. 6. A semiconductor memory device comprises a row decoder 10, a plurality of memory cell arrays $14_1$ to $14_n$ connected to a row decoder through row lines, a plurality of column select circuits $18_1$ to $18_n$ connected to the memory cell arrays through column lines, a column decoder 20 connected to column select circuits $18_1$ to $18_n$, sense amplifiers $22_1$ to $22_n$ correspondingly connected to the column select circuits $18_1$ to $18_n$, output buffer circuits $24_1$ to $24_n$ correspondingly connected to sense amplifiers $22_1$ to $22_n$, and depletion type MOS transistors 36 connected to the output lines of the column decoder 20 between the adjacent column select circuits $18_1$ to $18_n$. A power source voltage Vc is supplied to the gate of the MOS transistors 36.

With such an arrangement, upon operation of the column decoder 20, voltages appearing on the output lines of the column decoder 20 are sequentially delayed by the depletion type MOS transistors 36 and the delayed ones are transferred along the output lines. Accordingly, the column select circuits $18_1$ to $18_n$ are driven with given time lags, so that column lines of the memory cell arrays $14_1$ to $14_n$, one for each array, are never selected simultaneously. The times that the bit data from the memory cell arrays are led to the corresponding external output terminals, are made to differ. For this reason, the memory output signals are not changed concurrently. As a result, the large current never flows.

The difference of the drive times of the column select circuits, when compared with the operating time of the memory system, is small and negligible. The output lines of the column decoder have a load capacitance smaller than that of the row lines. Since the column lines are normally made of aluminum, the time from an instant that the address input signal changes till the potential on the output lines of the column decoder changes is shorter than the time from an instant that the address input signal changes till the potential on the row lines changes. There is no problem of the speed down of the memory data reading.

A second embodiment of a semiconductor device according to the present invention will be described referring to FIG. 7. The semiconductor device is comprised of two memory cell arrays, two column select circuits, and two sense amplifiers for one output buffer. Further, it has a first column decoder $20_1$ and a second column decoder $20_2$. The first column decoder $20_1$ drives column select circuit $18_{11}$ and $18_{12}$ to $18_{n1}$ and $18_{n2}$. The second column decoder $20_2$ drives sense amplifiers $22_{11}$ and $22_{12}$ to $22_{n1}$ and $22_{n2}$. Depletion type MOS transistors $36_1$ are connected to the column decoder output lines between a pair of column select circuits $18_{11}$ and $18_{12}$ and a pair of the column select circuits $18_{21}$ and $18_{22}$. In this way, the depletion MOS transistors $36_1$ are coupled with the column decoder output lines every two column select circuits. Similarly, depletion type MOS transistors $36_2$ are connected to the column decoder output lines between a pair of the sense amplifiers $22_{11}$ and $22_{12}$ and a pair of the sense amplifiers $22_{21}$ and $22_{22}$. In this way, the depletion MOS transistors $36_2$ are coupled with the column decoder output lines every two sense amplifiers.

With such connection, the drive start times of the column select circuits by the first column decoder $20_1$ are made to differ. The drive start times of the column select circuits by the second column decoders $20_2$ are similarly made to differ. Accordingly, the output buffers $24_1$ to $24_n$ are not changed concurrently when the column address changes.

When two sense amplifiers are switched, the second column decoder $20_2$ may be arranged so as to provide address data A and the inverted data $\overline{A}$. In other words, the second column decoder $20_2$ may be an address buffer circuit.

In FIG. 7, the MOS transistors $36_1$, which are used for making the drive start times differ, may be omitted, if the circuit is arranged such that pulses are generated in synchronism with changes of the column addresses, the second column decoder $20_2$ and the paired sense amplifiers $22_{11}$ and $22_{21}$ to $22_{n1}$ and $22_{n2}$ are dynamically driven and the output signal is produced from the second column decoder $20_2$ following the output signal from the first column decoder $20_1$.

Figures 8A, 8B, 8C:
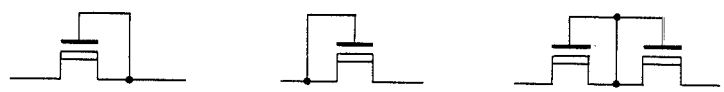
FIGS. 8A through 8E show some delay means applicable for the circuits shown in FIGS. 6 and 7.
Figures 8D, 8E:

FIGS. 8A to 8E show some examples used for the depletion type MOS transistors 36, $36_1$ and $36_2$ in the above-mentioned embodiment. The depletion type MOS transistors shown in FIGS. 8A and 8B are arranged such that the gate of the transistor is connected to the column decoder side or the opposite side in the circuit, respectively. The transistors of FIGS. 8C and 8D are the combinations of the MOS transistors of FIGS. 8A and 8B. FIG. 8E shows a circuit in which two inverters are series-connected.

It is possible to make the drive start times of the column select circuits or the sense amplifiers different by the column decoders. Accordingly, the instantaneous current caused when the capacitance of the output terminals are driven is reduced.

Figure 9:
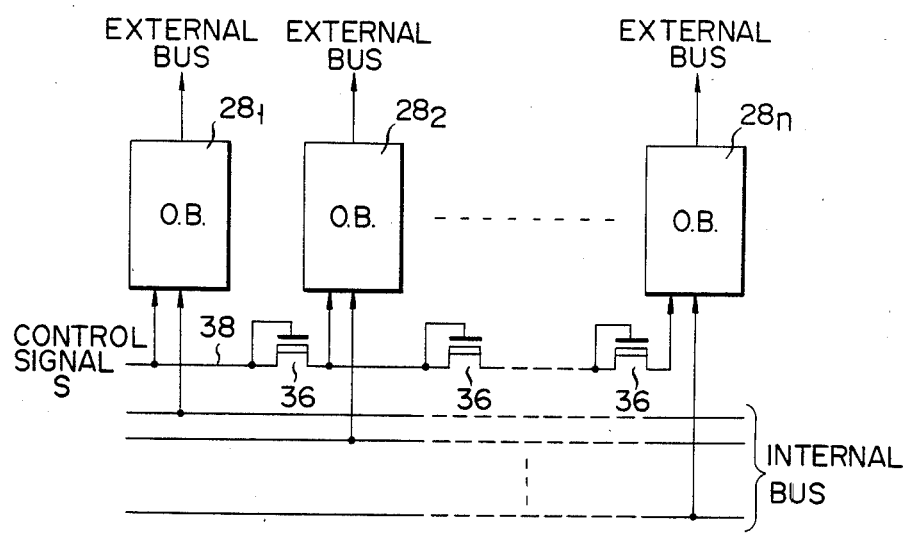
FIG. 9 shows a circuit diagram of a third embodiment of a semiconductor device according to the present invention.

A third embodiment of a semiconductor device will be described referring to FIG. 9. FIG. 9 shows an output buffer circuit of a central processing unit. The output buffers $28_1$ to $28_n$ provided between the external bus and the internal bus are controlled by the control signal S. When the control signal S is logic "0", the output buffer produces data. In this case, delay means are provided for preventing the output buffers $28_1$ to $28_n$ from being simultaneously turned on. The delay means are the depletion type MOS transistors 36 the gate of which are connected to the input side of the control line 38 to which the control signal S is applied. The MOS transistor 36 functions in order that a transfer delay time of the control signal S when the control signal S changes its logical level from "1" (high) to "0" (low) is longer than that when the control signal S changes from "0" to "1". Since the gate of the transistor 36 is connected to the control signal input side of the control line, there is a time difference between the cases that the gate of the transistor 36 is set at high level and that it is set at low level. Accordingly, the output buffers $28_1$ to $28_n$ do not produce data concurrently. Therefore, the peak current is not increased. The reason why the transfer times are made to differ in these level change situations is that when the output buffers produce output signals to the external bus, the signal producing times must be made to differ. All the output buffers must be set in a high impedance state as soon as possible, when the control signal S becomes high in level, that is, when no signal is produced, since the signals from the other devices are also outputted to the external bus.

A fourth embodiment of a semiconductor device according to the present invention will be described referring to FIGS. 10 to 12. In the present embodiment, the output buffers $28_1$ to $28_n$ are controlled by paired control signals A and B. In order to prevent the output buffers $28_1$ to $28_n$ from turning on simultaneously, delay means 36 similar to those in the third embodiment are provided on the control line $38_1$ for the control signal A. A signal $a_1$ not delayed is applied to the output buffer $28_1$ and a delayed signal $a_2$ is applied to the output buffer $28_2$. Similarly, the most delayed signal $a_n$ is applied to the output buffer $28_n$.

Figure 10:
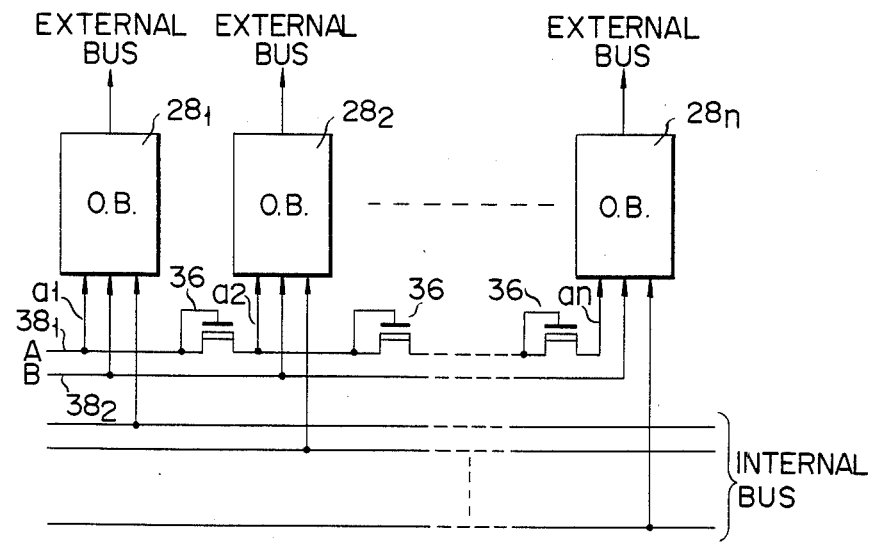
FIG. 10 shows a circuit diagram of a fourth embodiment of a semiconductor device according to the present invention.
Figure 11:
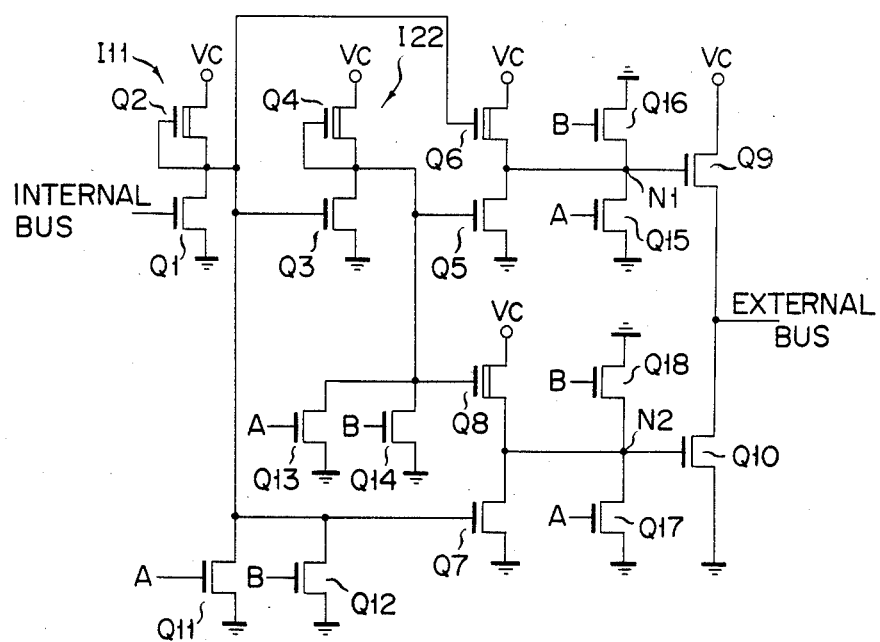
FIG. 11 shows a circuit diagram of an output buffer circuit used in the semiconductor device shown in FIG. 10.

FIG. 11 shows a practical arrangement of each of the output buffers $28_1$ to $28_n$ shown in FIG. 10. The output buffer is comprised of transistors $Q_1$ to $Q_{18}$. The enhancement type MOS transistors $Q_1$ connected at the gate to the internal bus and the depletion type MOS transistor $Q_2$ form an inverter $I_{11}$. The output signal from the inverter $I_{11}$ is supplied to an inverter $I_{22}$ made up of the enhancement type MOS transistor $Q_3$ and the depletion type MOS transistor $Q_4$. The output signal from the inverter $I_{11}$ is supplied to the gates of the depletion type MOS transistor $Q_6$ and the enhancement type MOS transistor $Q_7$. The output signal from the inverter $I_{22}$ is supplied to the gates of the enhancement type MOS transistor $Q_5$ and the depletion type MOS transistor $Q_8$. A node between the transistors $Q_5$ and $Q_6$ is connected to the gate of the enhancement type MOS transistor $Q_9$. The node between the transistor $Q_7$ and $Q_8$ is connected to the gate of the enhancement type MOS transistor $Q_{10}$. The node between the transistors $Q_9$ and $Q_{10}$ is connected to the external bus.

The output line of the inverter $I_{11}$, i.e. the node between the transistors $Q_1$ and $Q_2$, is grounded through the enhancement type MOS transistor $Q_{11}$ of which the gate receives the control signal A and the enhancement type MOS transistor $Q_{12}$ of which the gate receives the control signal B. The output line of the inverter $I_{22}$, i.e. the node between the transistors $Q_3$ and $Q_4$, is grounded through the enhancement type MOS transistor $Q_{13}$ receiving at the gate the control signal A and the enhancement type MOS transistor $Q_{14}$ receiving at the gate the control signal B. The node N1 between the transistors $Q_5$ and $Q_6$ is grounded through the enhancement type MOS transistor $Q_{15}$ receiving at the gate the control signal A and the enhancement type MOS transistor $Q_{16}$ receiving at the gate the control signal B. The node N2 between the transistors $Q_7$ and $Q_8$ is grounded through the enhancement type MOS transistor $Q_{17}$ receiving at the gate the control signal A and the enhancement type MOS transistor $Q_{18}$ receiving at the gate the control signal B.

The operation of the output buffers $28_1$ to $28_n$ thus arranged will be described referring to FIG. 12. When the control signals A and B are high in level, the potential at the nodes N1 and N2 are low in level. In this situation, all the buffer circuits do not operate. When the control signal A changes from high to low in level at time T1, the not delayed signal $a_1$ is applied to the output buffer $28_1$. The control signal B changes in synchronism with the control signal A. Accordingly, the transistors $Q_{11}$ to $Q_{18}$ are in an OFF state, so that data on the internal bus is outputted to the external bus.

The delayed control signals $a_2$ to $a_n$ are supplied to the output buffers $28_2$ to $28_n$ in succession. When the control signal $a_n$ changes from high to low in level at time T2, the output buffer $28_n$ produces data.

When the control signals A and B change from low to high at time T3, and the control signal $a_1$ and the control signal B are applied to the output buffer $28_1$ concurrently. Output buffer $28_1$ has a high impedance. In this case, the control signal B is supplied to the output buffers $28_2$ to $28_n$. Accordingly, the nodes N1 and N2 of the output buffers $28_2$ to $28_n$ are grounded. As a result, the output buffers $28_2$ to $28_n$ are also in a high impedance state. Then, all the output buffers $28_1$ to $28_n$ are in a high impedance state at time T3.

The semiconductor device as mentioned above can operate a plurality of output buffers with different time lags in a data outputting mode. In a nonoperating mode, the plurality of output buffers can be stopped concurrently. Consequently, the instantaneous peak current can be reduced.

Figure 13:
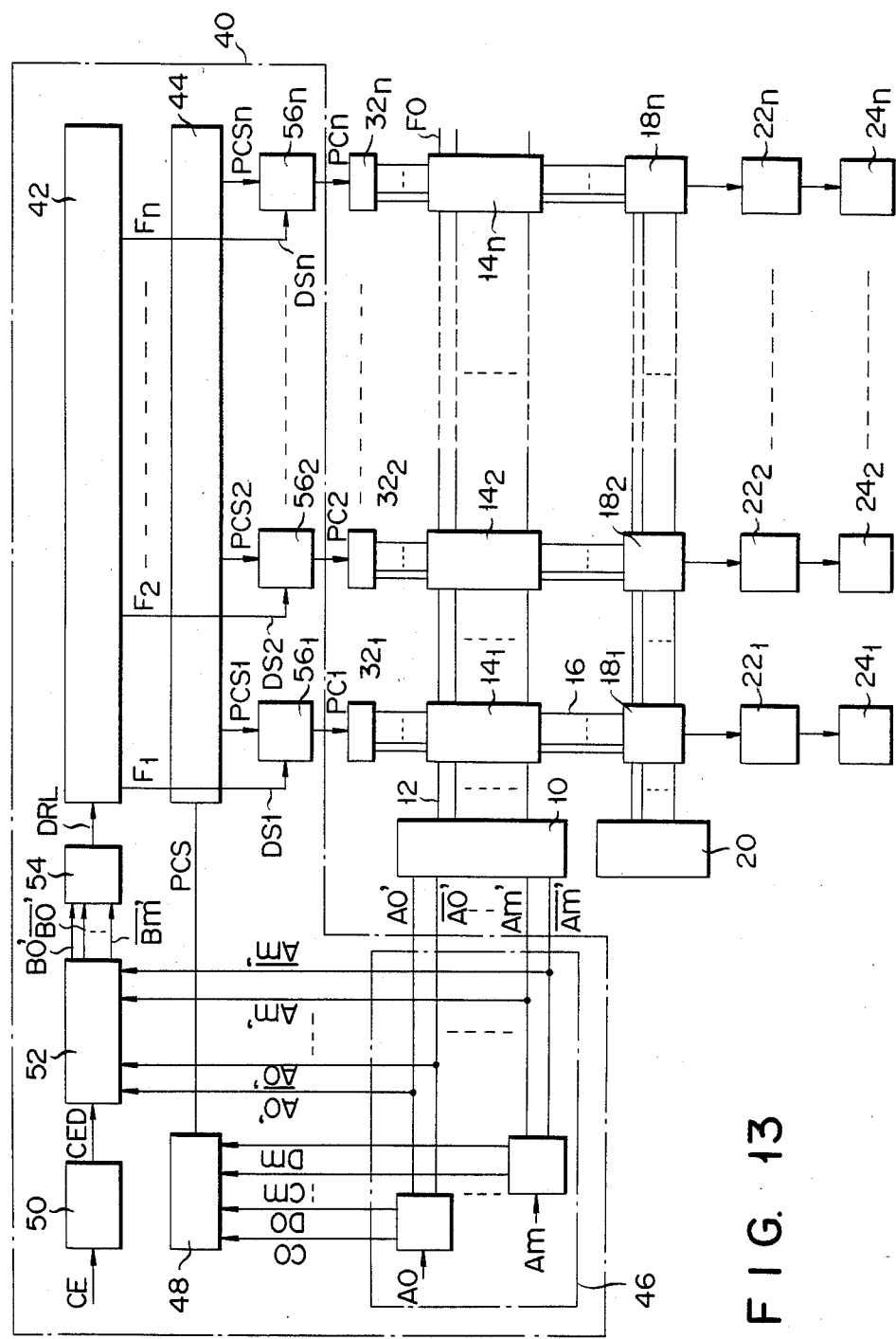
FIG. 13 shows a block diagram of a fifth embodiment of a semiconductor device according to the present invention.

A fifth embodiment of the semiconductor device will be described referring to FIG. 13. The semiconductor device comprises a row decoder 10, a plurality of memory cell arrays $14_1$ to $14_n$ connected to the row decoder 10 through the row line 12, a plurality of column select circuits $18_1$ to $18_n$ connected to the memory cell arrays $14_1$ to $14_n$ through the column lines 16, a column decoder 20 connected to the column select circuits $18_1$ to $18_n$, sense amplifiers $22_1$ to $22_n$ connected to the corresponding column select circuits $18_1$ to $18_n$, output buffer circuits $24_1$ to $24_n$ connected to the corresponding sense amplifiers $22_1$ to $22_n$, precharge circuits $33_1$ to $32_n$ connected to the column lines of the memory cell arrays $14_1$ to $14_n$, and a precharge time setting circuit 40 for setting precharge times of the precharge circuits $32_1$ to $32_n$. The precharge time setting circuit 40 determines the precharge start times and the precharge stop times based on a distance from the row decoder 10 to the memory cell arrays $14_1$ to $14_n$.

The precharge time setting circuit 40 is comprised of dummy row line 42, a delay circuit 44, an address buffer circuit 46, an address data detecting circuit 48, a circuit 50 for obtaining a delayed chip enable signal, a dummy address buffer circuit 52, a dummy row decoder 54 and precharge signal generating circuits $56_1$ to $56_n$.

The column line precharge circuits $32_1$ to $32_n$ for precharging the column lines 16 of the memory cell arrays $14_1$ to $14_n$ are under control of the precharge signals $PC_1$ to $PC_n$, respectively.

The precharge start is determined by the address buffer circuit 46, the address data detecting circuit 48, the delay circuit 44 and precharge signal generating circuits $56_1$ to $56_n$. The precharge stop time is determined by the address buffer circuit 46, the dummy address buffer circuit 52, the dummy row decoder 54, the dummy row line 42 and precharge generating circuits $56_1$ to $56_n$.

The dummy row line 42 has the same resistance and capacitance as that of the row line 12 and is provided for all the memory cell arrays $14_1$ to $14_n$.

Each of the precharge signals $PC_1$ to $PC_n$ is correspondingly produced every time each of the address signals Ao to Am in the address buffer circuit 46 is produced. Changes of the address signals Ao to Am are detected by the address data detecting circuit 48. A signal PCS from the address data detecting circuit 48 is inputted to the delay circuit 44. The output signals $PCS_1$ to $PCS_n$ from the delay circuit 44 are inputted to the precharge signal generating circuits $56_1$ to $56_n$, respectively. Then, the precharge signal $PC_1$ to $PC_n$ delayed corresponding to the memory cell arrays $14_1$ to $14_n$ rise, respectively. The precharge signals $PC_1$ to $PC_n$, respectively, fall in accordance with changes of potentials at the nodes $F_1$ to $F_n$ on the dummy row line 42 corresponding to the memory cell arrays $14_1$ to $14_n$.

The dummy row decoder 54 and the dummy address buffer circuit 52 are provided so that the dummy row line 42 may be selected at the same time when the row line 12 is selected in accordance with the address signals Ao to Am.

The precharge signal generating circuits $56_1$ to $56_n$ detect potential changes $DS_1$ to $DS_n$ at the nodes $F_1$ to $F_n$ on the dummy row line 42 and the output signals $PCS_1$ to $PCS_n$ from the delay circuit 44, and produce precharge signals $PC_1$ to $PC_n$, respectively.

Figure 1:
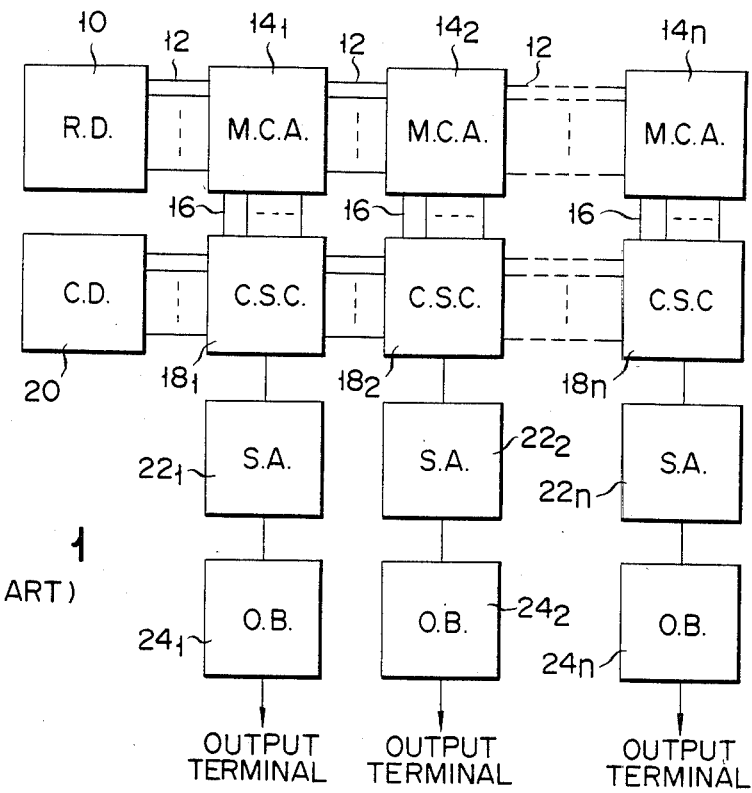
FIG. 1 is a block diagram of a prior semiconductor memory device.
Figure 2:
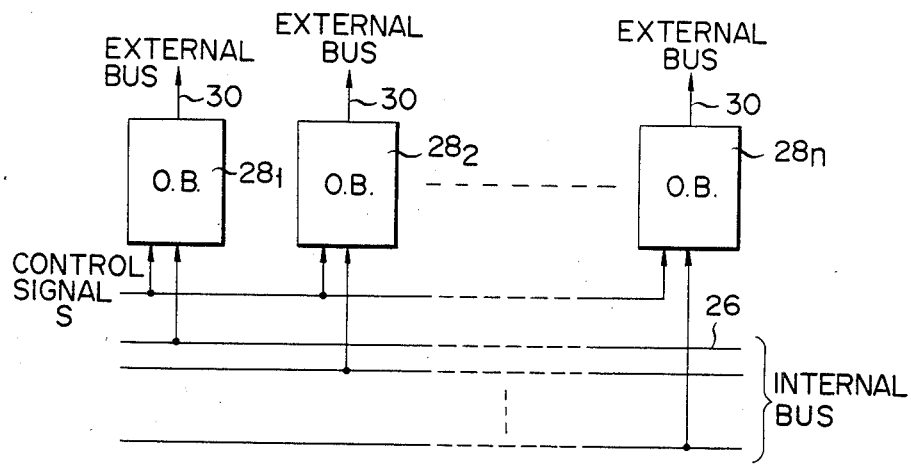
FIG. 2 is a block diagram of an output section of a prior central processing unit.
Figure 3:
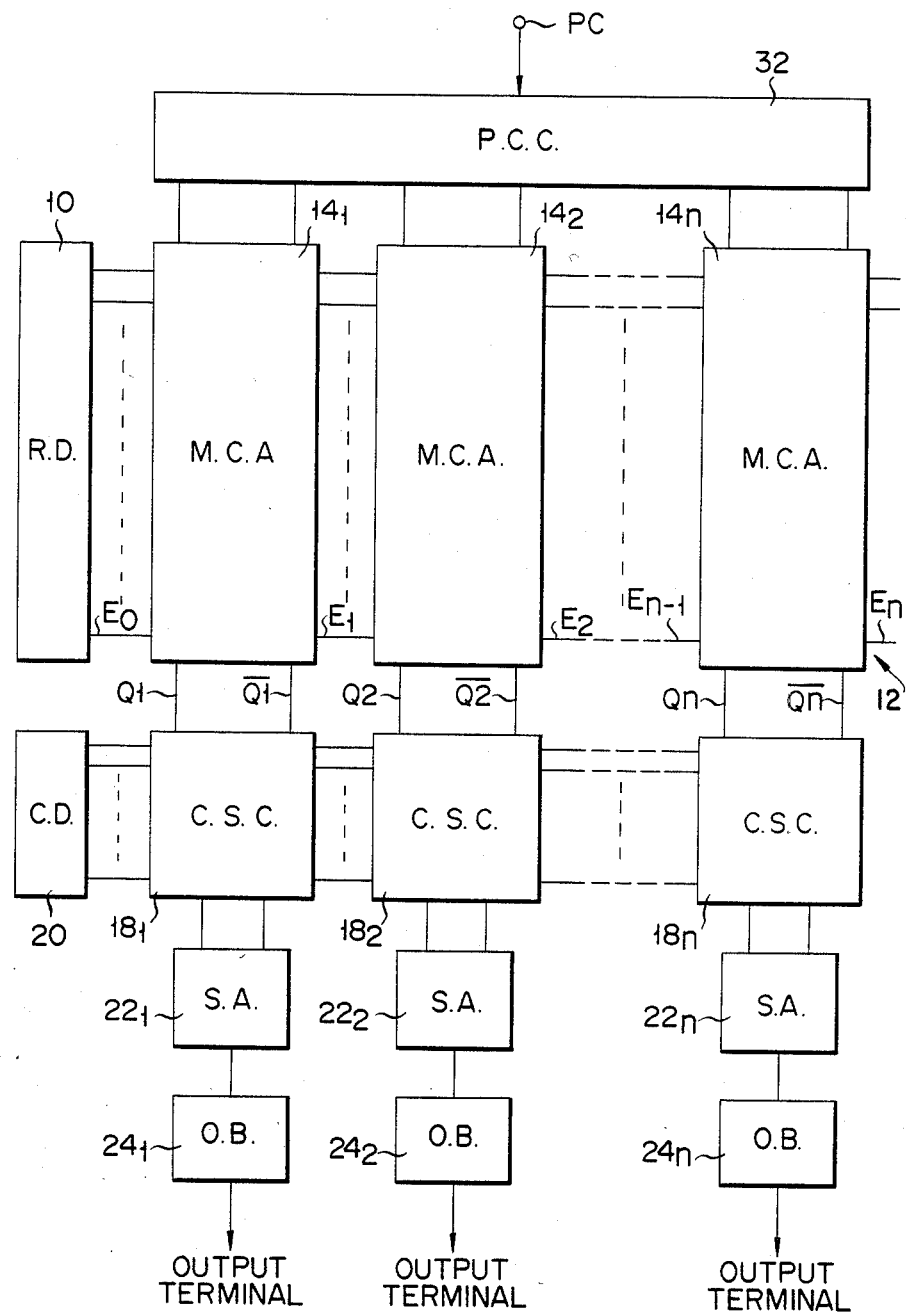
FIGS. 3 and 4 are block diagrams of prior semiconductor memory devices each with a precharge circuit for the column lines.

The prior semiconductor device determines the precharge time depending on a potential at the node $E_n$ on the row line of FIG. 3. The semiconductor device according to the present invention checks rises of the potentials at the nodes $F_1$ to $F_n$ on the dummy row line, and forms a precharge signal $PC_1$ at the node $F_1$, the precharge signal $PC_2$ at the node $F_2, \ldots$, the precharge signal $PC_n$ at the node $F_n$. The precharge times of the memory cell arrays $14_1$ to $14_n$ are determined by the signals $PC_1$ to $PC_n$, respectively.

The transfer times of data from the memory cells to the output buffers $24_1$ to $24_n$ are shorter as the memory cells are located closer to the row decoder 10. Accordingly, the sense amplifiers $22_1$ to $22_n$ and the output buffers $24_1$ to $24_n$ are not operated concurrently, resulting in great decrease of the instantaneous peak current. In the prior semiconductor device, data is outputted at a time point that the node $E_n$ (see FIG. 3) becomes "1" in level. In this respect, the entire time till the data is outputted is never longer than that of the prior one.

Figure 4:
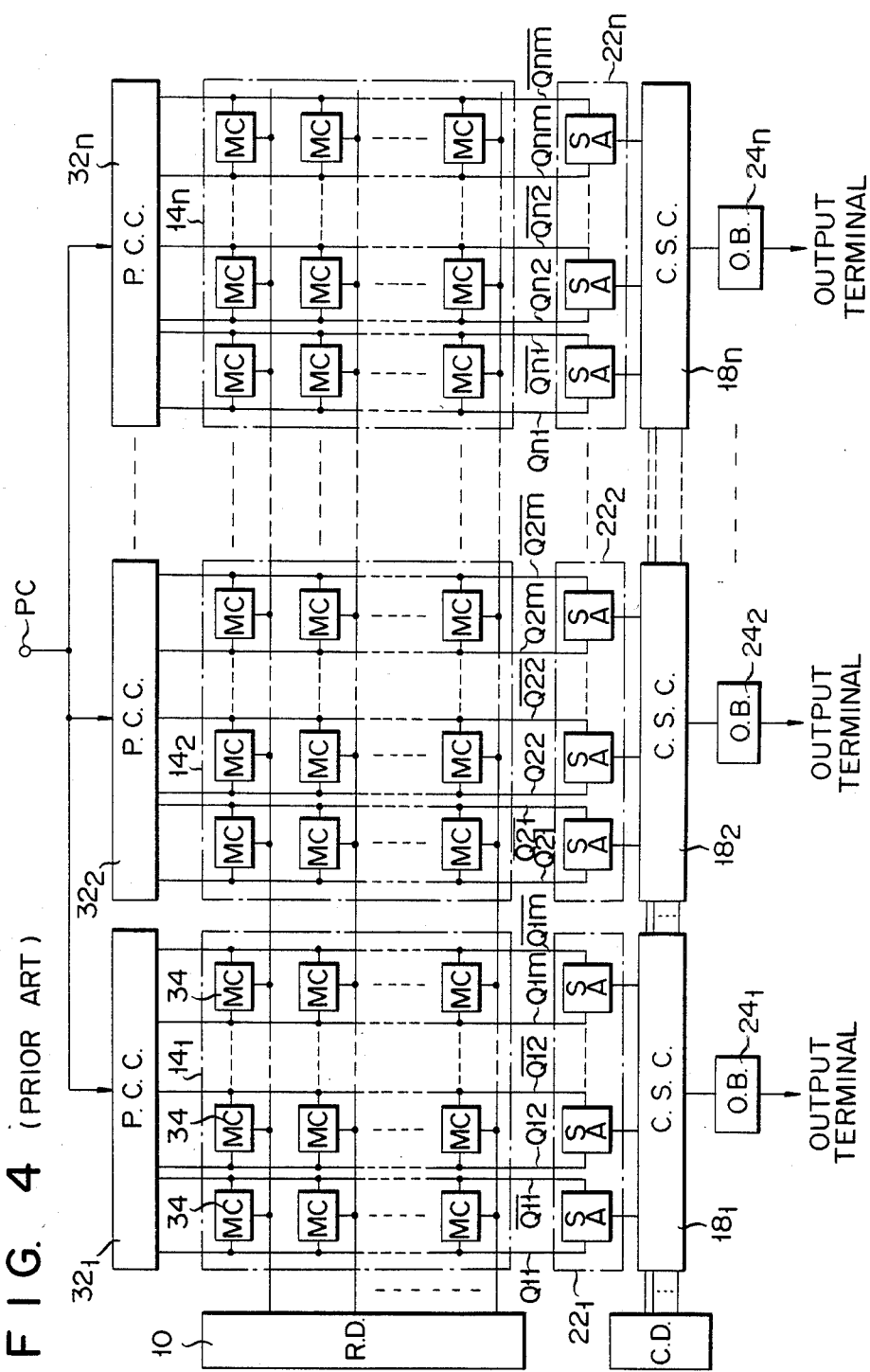
Figure 5:
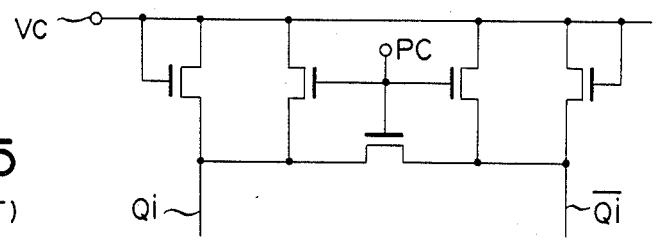
FIG. 5 is a circuit diagram of the precharge circuit.

The dummy row line 42 changes its potential from "0" to "1", like the selected row line 12, when the address input signal changes, as shown in FIG. 14. The node $F_1$ nearest the row decoder 10 first rises in level and the node $F_n$ farthest from the row decoder 10 last rises. By detecting a potential change on the dummy row line 42, a pulse width of each of the precharge signals $PC_1$ to $PC_n$ is determined, as shown in FIG. 15, depending on the potential rises at the nodes $F_1$ to $F_n$. Precisely, when the potential at the node $F_1$ on the dummy line 12 rises, the signal $PC_1$ falls to stop the precharge. When the potential at the node $F_2$ rises, the signal $PC_2$ falls to stop the precharge. Similarly, when the potential at the node $F_n$ rises, the signal $PC_n$ falls to stop the precharge. As shown in FIG. 15, the precharge signal $PC_n$ corresponds to the precharge signal PC of the prior semiconductor device (see FIGS. 3 and 4). These signals $PC_1$ to $PC_n$ become "1" in level in synchronism with a change of the address signal. In design, the precharge start times of the signals $PC_1$ to $PC_n$ are made different each other, allowing for the decrease of the instantaneous peak current.

Figure 16:
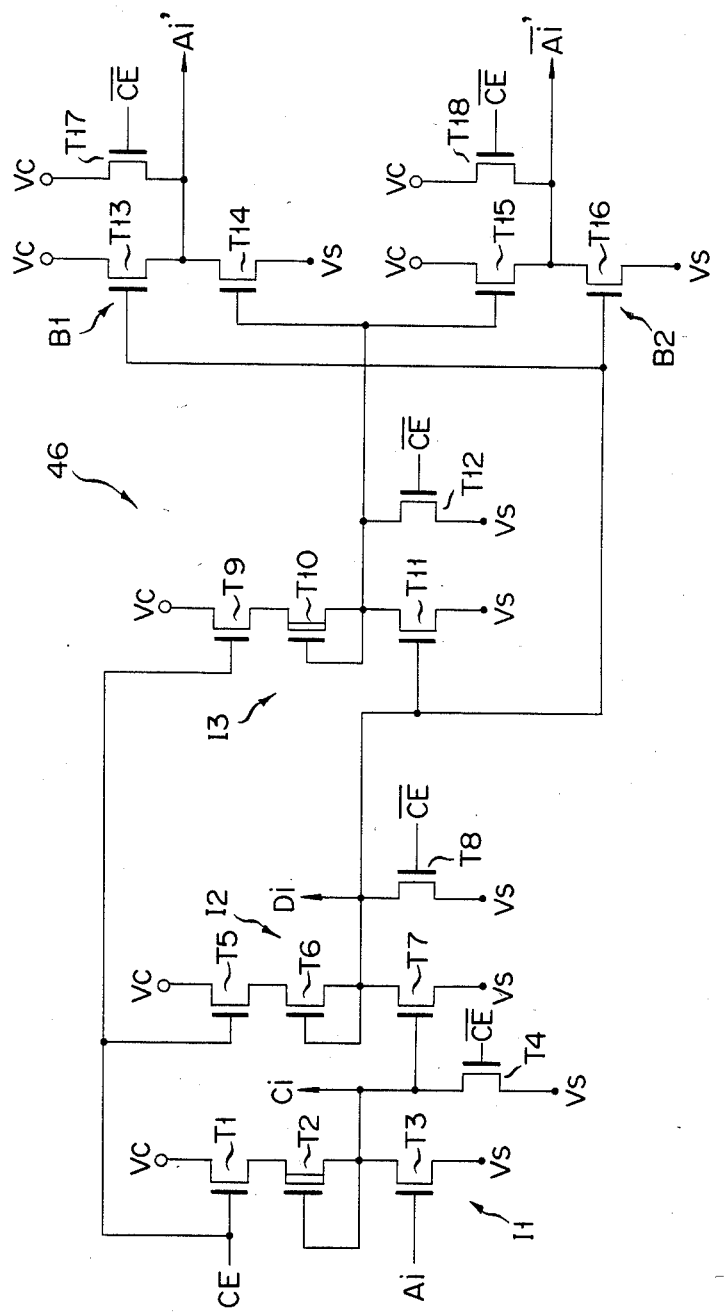
FIG. 16 shows a circuit diagram of an address buffer circuit used in the FIG. 13 circuit.

An arrangement of the precharge time setting circuit 40 will be described. FIG. 16 shows the address buffer circuit 46 for transferring address input data Ai (i=0, . . . , m) to the row decoder 10 and the column decoder 20. In the circuit, an enhancement type MOS transistor T1 receiving at the gate a chip enable signal CE, a depletion type MOS transistor T2 of which the gate and source are interconnected each other, and an enhancement type MOS transistor T3 receiving at the gate address data Ai are connected between the power sources Vc and Vs. The transistors T2 and T3 make up a first inverter $I_1$. A transistor T4 receiving at the gate the inverted signal $\overline{CE}$ of the signal CE is connected between the output terminal of the inverter $I_1$ and the power source Vs. Similarly, the transistors T5 to T7 are connected between the power source Vc and Vs. The output signal from the first inverter $I_1$ is inputted to the gate of the transistor T7. The transistors T6 and T7 make up a second inverter $I_2$. A transistor T8 receiving at the gate the inverted signal $\overline{CE}$ of the signal CE is inserted between the output terminal of the second inverter $I_2$ and the power sourve Vs. Transistors T9 and T12 are arranged similarly. The first buffer B1 is made up of transistors T13 and T14 and a second buffer B2 is made up of transistors T15 and T16. Transistors T17 and T18 having at the gate the inverted signal $\overline{CE}$ are connected to the output terminals of the first and second buffer circuits B1 and B2. The output signal of the second inverter $I_2$ is applied to the gates of the transistors T13 and T16. The output of a third inverter $I_3$ is applied to the gates of the transistors T14 and T15.

In the specification, the output signal from the first inverter $I_1$ is designated by Ci; the output signal from the second inverter $I_2$ by Di; the output signal from the first buffer B1 by Ai'; the output of the second buffer B2 by $\overline{Ai'}$.

The address buffer circuit operates when the chip enable signal CE is "1" and the inverted signal $\overline{CE}$ is "0". The circuit does not operate when CE="0" and $\overline{CE}$="1". The current flowing into the circuit at this time is substantially zero. When CE="0", the address buffer output signals Ai' and $\overline{Ai'}$ are both "1" irrespective of the address data Ai.

Explanation will be given when the address Ai changes under a condition that the chip is selected, that is, CE="1" and $\overline{CE}$="0", how the precharge signals $PC_1$ to $PC_n$ are produced.

In FIG. 16, the signal Ci is the inverted signal of the address data Ai and is delayed behind the address data Ai by the time taken for the signal to pass through the inverter $I_1$. The signal Di is the inverted signal of the signal Ci and delayed behind the signal Ci by the time taken for it to pass through the inverter $I_2$. The output signal Ai' delays behind the signal Di by the time taken for it to pass through the inverter $I_3$ and the first buffer circuit B1. The output signal $\overline{Ai'}$ delays behind the signal Di by the time taken for it pass through the inverter $I_3$ and the second buffer circuit B2.

FIG. 17 shows a practical arrangement of the address change detecting circuit 48. The address change detecting circuit 48 is comprised of enhancement type transistors T19 and T20, depletion type transistors T21 and T22, NOR gates 60 and 62, and enhancement type transistors T23 and T24. The enhancement type transistor T19 receives at the drain the signal Ci from the inverter $I_1$ and at the gate the signal Ai' from the buffer B1 of FIG. 16. The transistor T20 receives the signal Di from the inverter $I_2$ of FIG. 16 and at the gate the signal $\overline{Ai'}$ from the buffer B2 of FIG. 16. The transistor T21 is connected at the drain to the source of the transistor T19 and at the gate and source to the power source Vs. The transistor T22 is connected at the drain to the source of the transistor T20 and at the gate and source to the power source Vs. The output signal from the transistor T19, and the signals Ci' from the transistor T19, the output signal from the NOR gate 62 and the signal Di' from the transistor T20 are inputted to the NOR gate 60. The output signal from the NOR gate 60 and the potential $DS_n$ at the node $F_n$ of the row line 12 are inputted to the NOR gate 62. The output signal from the NOR gate 62 is inputted to the gate of the transistor T23. The output signal from the NOR gate 60 is applied to the gate of the transistor T24. The NOR gates 60 and 62 make up a flip-flop. The transistors T23 and T24 are arranged between the power sources Vs and Vc in series. The output signal from the buffer circuit B3 serves as a precharge set signal PCS.

The signal PCS is led to a delay circuit containing a resistor R and a capacitor C shown in FIG. 18. The delay circuit 44 produces signals $PCS_1$ to $PCS_n$ delayed properly. The delay circuit arrangement is illustrated only by way of example and may be constructed by proper component if its function is secured.

The signals $PCS_1$ to $PCS_n$ are respectively inputted to corresponding precharge signal generating circuits $56_1$ to $56_n$ shown in FIG. 19. The precharge signal generating circuits $56_1$ to $56_n$ are each a flip-flop made up of the NOR gates 64 and 66. Potentials $DS_1$ to $DS_n$ at the nodes $F_1$ to $F_n$ of the dummy row line are applied to the NOR gate 66. The flip-flop produces precharge signals $PC_1$ to $PC_n$ corresponding to the precharge circuits $32_1$ to $32_n$.

Figure 20:
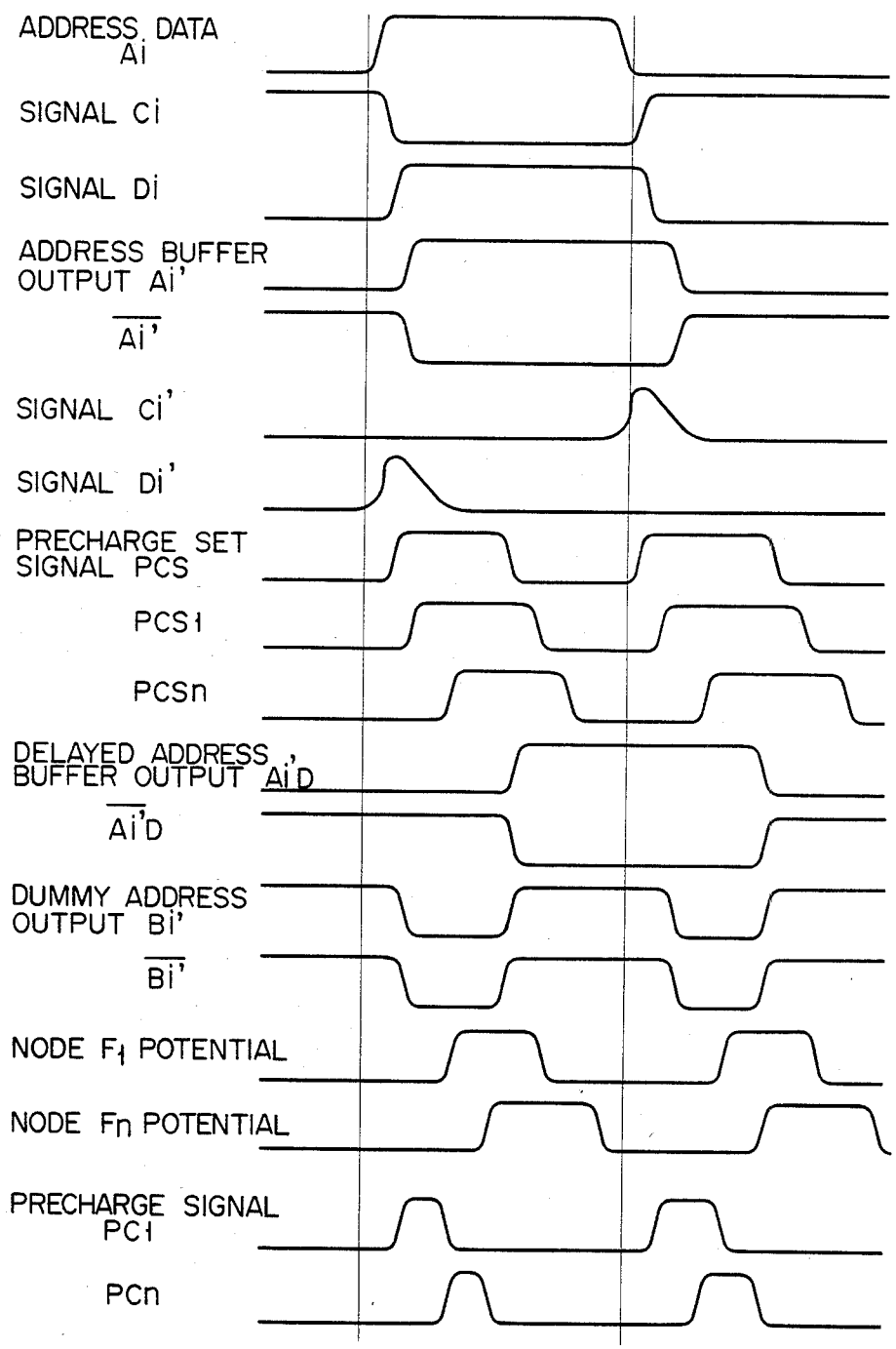
FIG. 20 shows timing chart useful in explaining the operation of the semiconductor device of FIG. 13 when a chip enable signal is "1"

The operations of the address buffer circuit 46, the address detecting circuit 48, the delay circuit 44, and the precharge signal generating circuits $56_1$ to $56_n$ will be described referring to signal waveforms of FIG. 20. In the circuit shown in FIG. 16, the signal Ci is delayed by the switching time of the inverter $I_1$ behind the address input signal Ai and the signal Di is delayed by the time of the inverters $I_1$ and $I_2$ behind the signal Ai. The address buffer output signal Ai' is delayed by the time of the inverter $I_3$ and the buffer B1 behind the signal Di. The address buffer output signal $\overline{Ai'}$ is delayed by the time of the inverter $I_3$ and the buffer B2 behind the signal Di. When the signal Ci changes from "0" to "1", the signal Ci' also changes from "0" to "1" through the transistor T19. Immediately after the change, in the circuit of FIG. 17, the delay of the address buffer output signal Ai' causes the signal Ci' to discharge through the transistor T21 (become "0") and changes the signal Ai' to "0". Accordingly, when the signal Ai changes from "1" to "0", the signal Ci' becomes "1" instantly.

Similarly, the signal Di' becomes "1" instantly when the signal Ai changes from "0" to "1".

Accordingly, the output signal from the NOR gate 60 becomes "0" in level. The potential on the dummy row line $F_n$ is "0" at this time, and therefore the output signal of the NOR gate 62 becomes "1". The result is that the transistor T23 becomes ON while the transistor T24 becomes OFF, and the precharge set signal PCS becomes "1". Since the signals Co' to Cm' and Do' to Dm' corresponding to the respective addresses Ao to Am are inputted to the NOR gate 60, the precharge set signal PCS changes to "1" when either of the addresses changes. The signals PCS becomes signals $PCS_1$ to $PCS_n$ which are successively delayed by the circuit of FIG. 18.

If the signal $PCS_1$ is inputted to the NOR gate 64 in the flip-flop of the precharge signal generating circuit 56, the node $F_1$ potential is applied to the NOR gate 66. At this time, the node $F_1$ potential is "0", so that the output signal of the NOR gate 66 is "1" if the signal $PCS_1$ is "1". Thus, the precharge signal $PC_1$ corresponding to the precharge circuit $32_1$ is obtained. Similarly, the signals $PC_2$ to $PC_n$ corresponding to the respective precharge circuits $32_2$ to $32_n$ are formed. In this way, the column line 16 is precharged.

Figure 21:
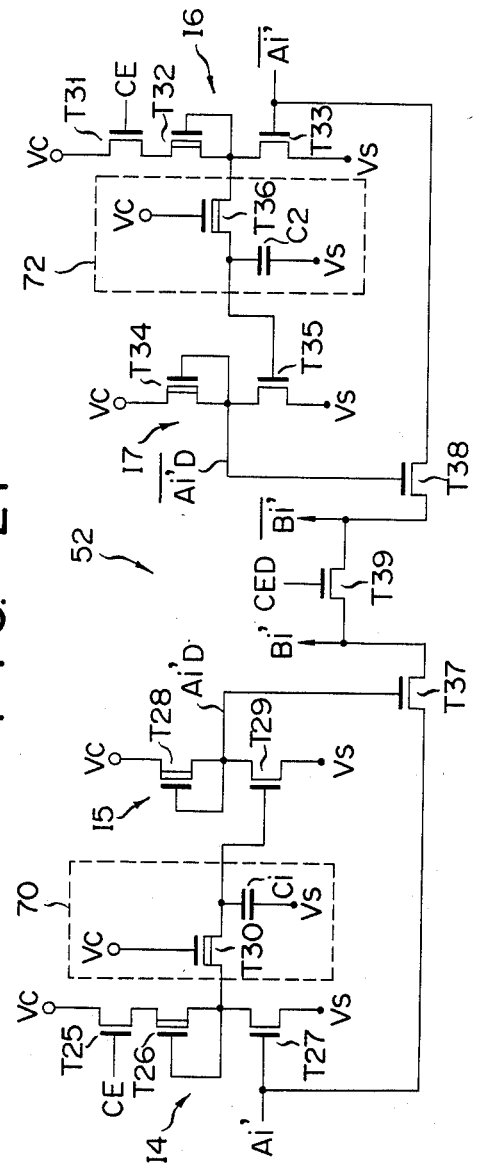
FIG. 21 is a circuit diagram of a dummy address buffer circuit used in the FIG. 13 circuit.

A following circuit is a circuit for stopping the precharge. FIG. 21 is a circuit 52 for producing dummy address buffer output signals Bi' and $\overline{Bi'}$ to be applied to the decoder for the dummy row line 42. As in the circuit shown in FIG. 16, the transistors T25 to T27 are connected between the power sources Vc and Vs. The chip enable signal CE is applied to the gate of the transistor T25. An address buffer output signal Ai' is inputted to the gate of the transistor T27. The transistors T26 and T27 form an inverter $I_4$. The transistors T28 and T29 form an inverter $I_5$. A delay circuit 70 including a transistor T30 connected at the gate to the power source Vc and a capacitor C1 at one end to the power source Vs is provided between the inverters $I_4$ and $I_5$.

The transistors T31 to T33 are connected between the power sources Vc and Vs. The chip enable signal CE is applied to the gate of the transistor T31. An address buffer output signal $\overline{Ai'}$ is inputted to the gate of the transistor T33. Transistors T32 and T33 form an inverter $I_6$ and the transistors T34 and T35 form an inverter $I_7$. A delay circuit 72 including a transistor T36 and a capacitor C2 is connected between the inverters $I_6$ and $I_7$. The gate of a transistor T37 is coupled to the output terminal of the inverter $I_5$, the drain is supplied with the buffer output Ai' and the dummy address output Bi' is outputted from the source. The gate of a transistor T38 is coupled to the output terminal of the inverter $I_7$, at the drain to the buffer output $\overline{Ai'}$, and at the source to the inverted dummy address output $\overline{Bi'}$. A transistor T39 receiving at the gate a delayed chip enable signal CED is provided between the address output Bi and $\overline{Bi'}$.

Figure 22:
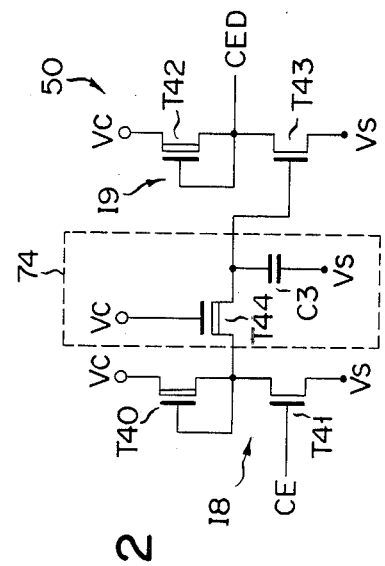
FIG. 22 is a circuit diagram of a circuit for obtaining a delay chip operation signal used in the FIG. 13 circuit.

FIG. 22 shows a circuit 50 for forming the delayed chip enable signal CED. Transistors T40 and T41 form an inverter $I_8$. Transistors T42 and T41 form an inverter $I_9$. A delay circuit 74 including a transistor T44 and a capacitor C3 is provided between the output terminal of the inverter $I_8$ and the input terminal of the inverter $I_9$. A chip enable signal CE is inputted to the inverter $I_8$ and the inverter $I_9$ produces a delayed chip enable signal CED delayed a given time.

In the circuit 52 in FIG. 21, when the signal CE is "1", the delayed enable signal CED is also "1". Delayed address buffer signals AiD' and $\overline{Ai'D}$ are produced by delaying the signals Ai' and $\overline{Ai'}$ a given time by the delay circuits 70 and 72, respectively. When the signal CED is "1", the signal Bi' and $\overline{Bi'}$ become in-phase signals as the result of the short circuiting by the transistor T39. When the buffer output Ai' changes from "1" to "0", the signal Bi' changes from "1" to "0". At this time, the signal Ai'D is "1" and $\overline{Ai'D}$ is "0". These signals Ai'D and $\overline{Ai'D}$ become "0" and "1" with a given time delay with respect to the signals Ai' and $\overline{Ai'}$, respectively. At this time, the signal $\overline{Ai'}$ is "1". Accordingly, the signals Bi' and $\overline{Bi'}$ return to "1" in level.

Figure 23:
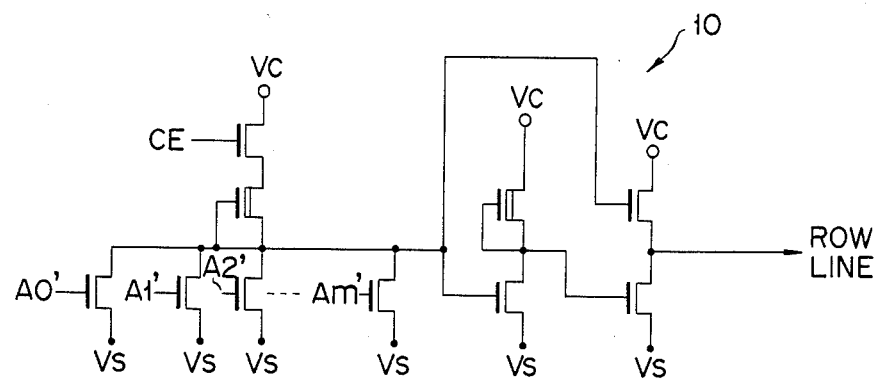
FIG. 23 is a circuit diagram of a row decoder in the FIG. 13 circuit.
Figure 24:
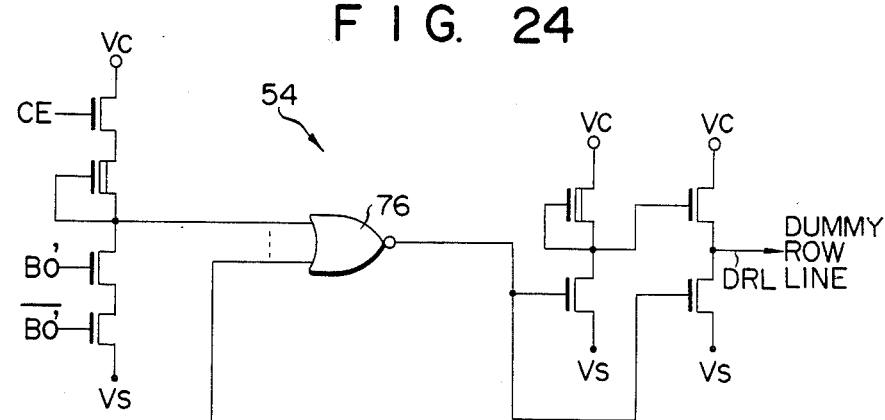
FIG. 24 is a circuit diagram of a dummy row decoder used in the FIG. 13 circuit.

FIG. 23 shows an ordinary row decoder 10 for selecting a given row line 12 in response to address data Ao' to Am'. FIG. 24 shows a dummy row decoder 54 for selecting a desired row line 42. The address buffer output signals Ai' and $\overline{Ai'}$ are applied to the circuit of FIG. 23 to select the row line 12. The dummy buffer output signals Bi' and $\overline{Bi'}$ are applied to the FIG. 24 circuit to select a desired dummy row line 42. The dummy address output signals Bo' and $\overline{Bo'}$, . . . , Bi' and $\overline{Bi'}$, . . . , Bn' and $\overline{Bn'}$ are applied to the dummy row decoder of FIG. 24 substantially at the same time as the address buffer outputs Ai' and $\overline{Ai'}$ are inputted to the row decoder 10 of FIG. 23.

Figure 25:
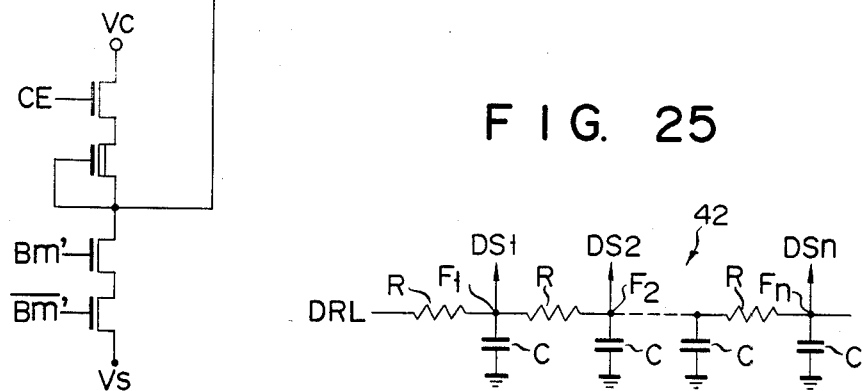
FIG. 25 is a circuit diagram of a dummy row line used in the FIG. 13 circuit.

In FIG. 24, there is shown a decoder for selecting one dummy row line in response to any one of the dummy address outputs by using a NOR gate 76. Alternatively, by using (n+1) dummy row lines, single dummy row lines are respectively selected, one for one, by dummy address output signals Bo' and $\overline{Bo'}$, . . . , Bi' and $\overline{Bi'}$, . . . , Bn' and Bi'. Substantially at the same time as the row line 12 selected by the row decoder 10 changes from "0" to "1" in level, the dummy row line 42 changes from "0" to "1". The signal DRL is inputted to the dummy row line 42 of FIG. 25 to drive the nodes $F_1$ to $F_n$ to produce signals $DS_1$ to $DS_n$. The signals $DS_1$ to $DS_n$ are inputted to the flip-flop of FIG. 19 to render the precharge signals $PC_1$ to $PC_n$ "0" sequentially. Similarly, the signal $DS_n$ is applied to NOR gate 62 of FIG. 17 to render the signal PCS "0". In this way, the precharge cycles of the precharge circuits $32_1$ to $32_n$ are finished in succession.

Figure 26:
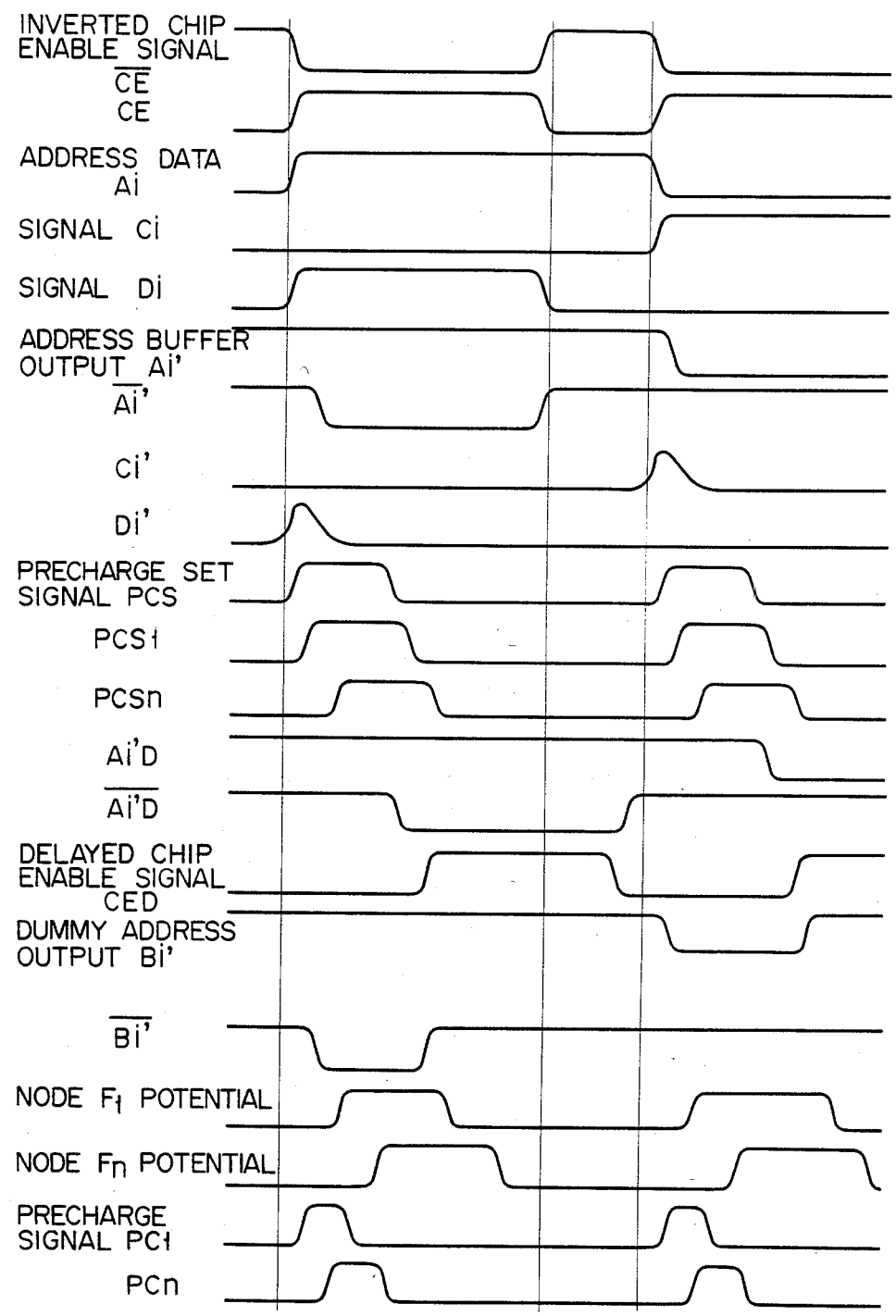
FIG. 26 shows a timing chart for explaining the operation of the FIG. 13 circuit when the chip enable signal shifts to an operation mode.

An operation in which the chip enable signal CE changes from "0" to "1" and the signal $\overline{CE}$ changes from "1" to "0", will be described referring to FIG. 26 illustrating voltage waveforms. Also when the chip shifts from a non-operation mode to an operation mode, the signals Ci' and Di' are produced. The operating process until the precharge set signals $PCS_1$ to $PCS_n$ and the precharge signals $PC_1$ to $PC_n$ become "1" is exactly the same as that as mentioned above. When the chip operation signal CE changes from "0" to "1", the delay chip operation signal CED shown in FIG. 22 changes from "0" to "1" after a given time. Accordingly, when the address buffer output signal Ai' changes from "1" to "0", the signal CED is left "0". Therefore, the signal Bi' changes from "1" to "0", and the signal $\overline{Bi'}$ remains "1".

When the delayed chip operating signal CED becomes "1" in level after a fixed time, the signal Ai'D is also "0" and thus the signal Bi' changes to "1". When the signal Bi changes its level from "1" to "0", the row line is selected by the address buffer outputs Ai' and $\overline{Ai'}$ in the row decoder 10. At this time, the signal Bi, changes its logical level from "1" to "0", so that the selected dummy row line 16 changes its logical level from "0" to "1". Then, the potential signals $DS_1$ to $DS_n$ at the nodes $F_1$ to $F_n$ on the dummy row line 42 are applied to the flip-flop in FIG. 19. The precharge signals $PC_1$ to $PC_n$ change their logical state from "1" to "0". Accordingly, the operation of the precharge circuit $32_1$ to $32_n$ completes. Also when the chip enable signal CE changes its logical state from "0" to "1", the circuit operates well.

A sixth embodiment of the present invention will be described referring to FIG. 27.

Figure 28:
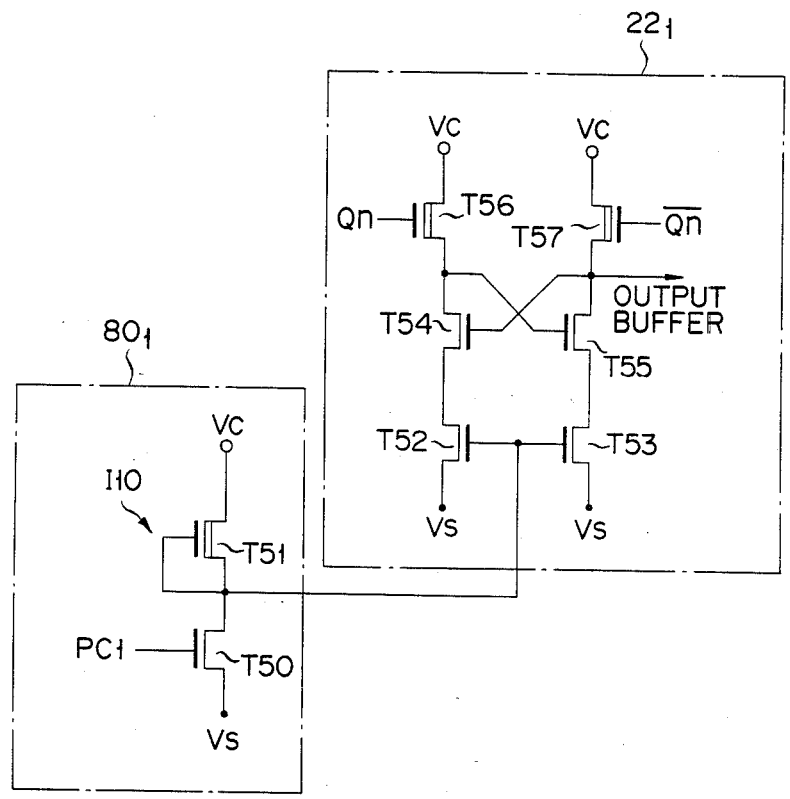
FIG. 28 is a circuit diagram including a sense amplifier and a sense amplifier drive circuit used in the FIG. 27 circuit.

FIG. 27 shows a semiconductor device having circuits $80_1$ to $80_n$ for operating sense amplifiers $22_1$ to $22_n$ in synchronism with precharge signals $PC_1$ to $PC_n$. The circuit arrangement of FIG. 27 is the same as that of FIG. 13 except for the circuits $80_1$ to $80_n$. FIG. 28 is a practical arrangement of the sense amplifier $22_1$ and the circuit $80_1$ for operating it. The circuit $80_1$ is an inverter $I_{10}$ made up of transistors T50 and T51. The precharge signal $PC_1$ is applied to the gate of the transistor T50. The sense amplifier $22_1$ is made up of transistors T52 to T57. The output signal from the inverter $I_{10}$ is applied to the gates of the transistors T52 and T53. A pair of column lines $Q_n$ and $\overline{Q_n}$ are connected to the gates of depletion type transistors T56 and T57.

With such an arrangement, when the precharge operation to the column lines $Q_n$ and $\overline{Q_n}$ terminates and the data in the memory cell selected appear on the column lines $Q_n$ and $\overline{Q_n}$, the precharge signals $PC_1$ to $PC_n$ become "0" in level. As a result, the transistors T52 and T53 turn on and the sense amplifier $22_1$ starts its operation.

Subsequently, the sense amplifier $22_2$ starts its operation in response to the precharge signal $PC_2$ and the sense amplifier $22_n$ responds to the precharge signal $PC_n$ to start its operation. Since the operating times of the sense amplifiers $22_1$ to $22_n$ are shifted from one another, the instantaneous peak current may further be reduced. When the information of the memory cell selected appears on the column lines $Q_n$ and $\overline{Q_n}$, the precharge signals $PC_1$ to $PC_n$ for operating the sense amplifiers $22_1$ to $22_n$ are produced. Therefore, the operation of the sense amplifiers $22_1$ to $22_n$ is speeded up.

In the above-mentioned embodiments, the precharge period is set by detecting a logical level change from "0" to "1" on the dummy row line 42. Alternatively, the precharge period may be set by detecting a logical level change from "1" to "0" on the same line.

The above-mentioned embodiment employs the same number of the output buffer circuits as that of the precharge signals $PC_1$ to $PC_n$. If the number of the latter is larger than that of the former, however, the peak current can be further reduced. In a situation where the requirement for the value of the peak current is not strict, the number of the precharge signal may be smaller than that of the buffer circuits.

What we claim is:

1. A semiconductor device comprising:
   data supply means;
   a plurality of output means, each connected to said data supply means;
   means for causing all of said output means to change simultaneously from operation states to non-operation states, said simultaneous change causing means including a first control line through which a first control signal is transferred; and
   delay means, connected to said plurality of output means, for causing said plurality of output means to operate and output data from said data supply means at different times in order to reduce peak instantaneous currents, said delay means including at least one depletion type MOS transistor whose conduction path is in series with a second control line through which a second control signal of said output means is transferred, the gate of said MOS transistor being connected to the end of said second control line to which said second control signal enters, and said second control signal changing levels in synchronism with said first control signal.

2. A semiconductor device comprising:
   data supply means having
   a plurality of row lines,
   a row decoder for selecting one of said row lines in response to an address signal,
   a plurality of memory cell arrays each including nemory cells for storing data, said memory cells being arranged in rows and columns and being driven by said selected row line,
   a plurality of column lines to receive data read out from said driven memory cells, and
   a column decoder for selecting one of said plurality of column lines for delivering from said data supply means the data received from said cells;
   output means for producing a plurality of data delivered from said data supply means;
   precharge means for precharging said column lines; and
   precharge time setting means for setting precharge times for said precharge means to correspond to the distances on a row line from said row decoder, said precharge time setting means further including
   an address buffer circuit for producing a plurality of successive signals in response to said address signal,
   an address change detecting circuit for producing a precharge set signal to form a precharge signal by detecting a change of said address signal, said address change detecting circuit being supplied with certain of said plurality of signals from said address buffer circuit,
   a delayed chip enable signal generating circuit for producing a delayed chip enable signal delayed a given amount of time in response to a chip enable signal inputted to said semiconductor device, an address buffer output delay circuit having as inputs an address buffer output signal and an inverted address buffer output signal received from said address buffer circuit, said address buffer output delay circuit producing a delayed address buffer output signal and a delayed inverted address buffer output signal both delayed a preset time from said address buffer output signal and said inverted address buffer output signal, respectively, when said chip enable signal is "one", said address buffer output signal and said inverted address buffer output signal both being connected to two output terminals, a gate circuit connected between said two output terminals and being controlled by a signal from said delayed chip enabled signal generating circuit, a dummy row decoder for receiving signals from said two output terminals, a dummy row line driven by an output signal from said dummy row decoder, and an end timing circuit for causing the end of said precharging in response to the detection of a potential at a given point on said dummy row line.

* * * * *